United States Patent [19]

Agraz-Guerena et al.

[11] 4,199,775
[45] Apr. 22, 1980

[54] INTEGRATED CIRCUIT AND METHOD FOR FABRICATION THEREOF

[75] Inventors: Jorge Agraz-Guerena, Puebla, Mexico; Alan W. Fulton, Batavia, Ill.

[73] Assignee: Bell Telephone Laboratories, Incorporated, Murray Hill, N.J.

[21] Appl. No.: 502,674

[22] Filed: Sep. 3, 1974

[51] Int. Cl.$^2$ .............................................. H01L 27/10
[52] U.S. Cl. ........................................ 357/46; 357/15; 357/44; 357/48; 357/89; 357/92
[58] Field of Search ...................... 357/91, 15, 36, 44, 357/46, 48; 307/317 A, 213, 214, 215, 303

[56] References Cited

U.S. PATENT DOCUMENTS

| | | | |
|---|---|---|---|
| 3,736,477 | 5/1973 | Berger et al. | 357/44 |
| 3,775,192 | 11/1973 | Beale | 357/91 |
| 3,823,353 | 7/1974 | Berger et al. | 357/44 |
| 3,869,622 | 3/1975 | Shimizu | 357/46 |

OTHER PUBLICATIONS

Schuenemann et al., IBM Tech. Discl. Bulletin, vol. 15, No. 2, Jul. 1972, pp. 509-510.
Berger, "Bipolar Devices for Low Power Digital Applications . . .", Solid State Devices 1973, (The Institute of Physics, London) (Proc. 3rd European Solid State Device Research Conference, Munich, Sep. 18-21, 1973), pp. 118-123.

Primary Examiner—William D. Larkins
Attorney, Agent, or Firm—John C. Albrecht; Arthur J. Torsiglieri

[57] ABSTRACT

An integrated transistor circuit arrangement provides a multicollector transistor with Schottky diodes and ohmic connections selectively formed at the collector terminals. In the illustrative example, a vertical transistor is formed in an N-type epitaxial layer overlying an N+ substrate. A through-extending region of P+ material encircles the region of the epitaxial layer in which the vertical transistor is formed. The base of the vertical transistor is formed by the implanting of P-type impurity in a location spaced apart from the surfaces of the epitaxial layer. The resulting base has a symmetrical profile relative to the faces of the epitaxial layer. Therefore, the transistor may be operated with the collector at the surface without penalty of electrical operation. In the illustrative example, a PNP lateral transistor is utilized as a current source for the vertical transistor.

22 Claims, 9 Drawing Figures

INTEGRATED CIRCUIT AND METHOD FOR FABRICATION THEREOF

FIELD OF THE INVENTION

This invention relates to improved semiconductor devices and method of manufacture thereof.

SUMMARY OF THE INVENTION

In accordance with the present invention, vertical three-element semiconductor devices are formed in an epitaxial layer overlying a relatively low resistance region of a substrate such that the collector and emitter regions thereof extend to respective surfaces of the epitaxial layer and the base region thereof is intermediate the said emitter and collector regions and does not extend to the exposed surface of the epitaxial layer.

Advantageously, pluralities of such devices may be disposed in spaced apart relationship to form logical circuit complexes, and the low resistance region of the substrate can be advantageously utilized to distribute power to the vertical structures. Further, three-element lateral devices, also in the epitaxial layer, can be utilized to connect power to the intermediate elements of the vertical structures without a requirement for metal surface interconnections.

Semiconductor devices in accordance with this invention are achieved through a process which includes, but is not limited to, the following steps which are performed on a chip which comprises an epitaxial layer of one conductivity type overlying a resistive substrate region of the same conductivity type:

1. Establishing in the epitaxial layer a region of the opposite conductivity type extending through the expitaxial layer to the substrate and shaped to encircle a selected region of the epitaxial layer;
2. Implanting a region of the said opposite conductivity type between, but spaced apart from the surfaces of the epitaxial layer, thereby forming in each encircled region a vertical three-element semiconductor device;
3. Forming for each encircled region a corresponding metallized contact at the exposed surface of the epitaxial layer and overlying a part of the corresponding encircled region.

Advantageously, semiconductor devices formed by these steps exhibit a high degree of symmetry of electrical performance because of the symmetry of the impurity profile of the implanted base region. Accordingly, in the semiconductor devices so formed, the elements which are at the exposed surface of the epitaxial layer may be utilized as collectors or emitters without penalty of electrical performance. In the event that asymmetry of electrical performance is desirable, it is theoretically possible through successive implants to create the desired asymmetry. However, with successive implants there is a broadening of the base region which may be undesirable.

Because of the symmetry of the vertical three-element devices achieved in accordance with this invention, it is advantageously possible to create complex logical circuit arrangements wherein the collectors of the devices may be either at the exposed surface of the epitaxial layer or at the surface of the epitaxial layer which lies adjacent to the substrate. Thus, efficient logical circuit arrangements such as those shown in FIG. 3 and 6 may be fabricated.

In one illustrative embodiment of the invention, an N-type epitaxial layer overlays an N+ substrate and the vertical structures comprising NPN devices are surrounded by corresponding low resistance P-type regions which serve to interconnect the P elements of the vertical structures one to the other and to a signal course.

Advantageously, the three-element vertical structures as described above permit the application of metallized contacts at the surface of the epitaxial layer such that low resistance, ohmic contacts and Schottky diode contacts can be selectively formed.

The vertical three-element semiconductor devices which are accomplished according to this invention exhibit an improved response time as compared to prior art three-element vertical devices which have their collectors at the exposed epitaxial surfaces. Their response time is improved without an increase in power of the applied signal and their ultimate response time with increased power is less than the response time of prior devices. Furthermore, the possibility of the inclusion of Schottky diode devices at the collectors of these vertical devices reduces the requirement for interconnections in logic circuit complexes and provides for reduced logic signal levels.

The response time of the vertical devices of this invention is improved as a direct result of the impurity profiles of such devices as compared to priorly known double diffused vertical structures. The implanted base of the present invention has a symmetrical impurity profile relative to the emitter and collector regions and this symmetry tends to eliminate the retarding field encountered in double diffused vertical structures which utilize the exposed epitaxial layer as the collector region. Furthermore, the charge in the emitter region of priorly known double diffused vertical structures is substantially higher than the charge in the emitter region of devices in accordance with the present invention. This reduction in charge also tends to improve the response time of these devices. The collector regions of vertical devices produced by the priorly known double diffusion process have lower resistivity than the collector regions of the vertical devices produced in accordance with the present invention and therefore these prior devices have higher collector to base capacitance which tends to increase their response time.

Although the present invention is illustrated by means of an N-type epitaxial layer overlying an N+ substrate, it should be noted that it is possible to practice this invention through the use of a P-type epitaxial layer overlying a P+ substrate. The resulting PNP vertical structures exhibit longer response times than the corresponding NPN devices of the illustrative example set forth herein because of the inherent lower mobility of holes compared to electrons. Furthermore, the range of metals suitable for producing Schottky diodes at the exposed surface of PNP devices is far more limited.

DETAILED DESCRIPTION

Figure 1:
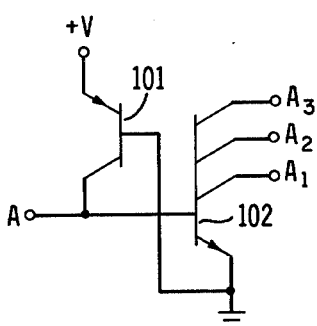
FIG. 1 is a schematic diagram of a prior art device which comprises a multicollector transistor and a three-element lateral current source connected to the base.
Figure 3:
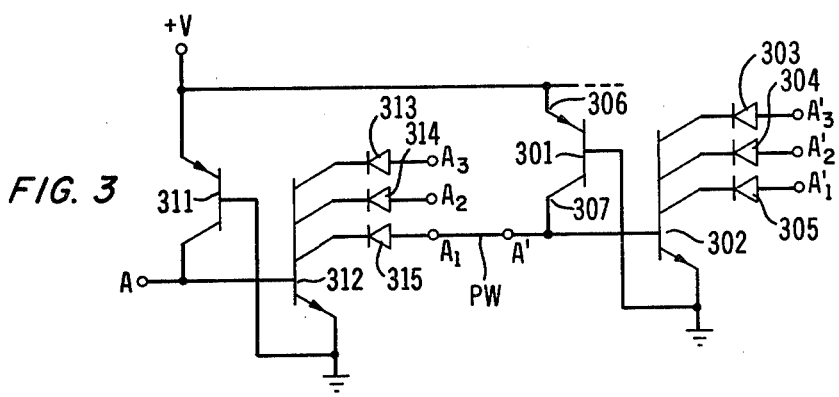
FIG. 3 shows two of the circuit arrangements of FIG. 1 in cascade with the addition of a Schottky diode in each of the collectors.
Figure 6:
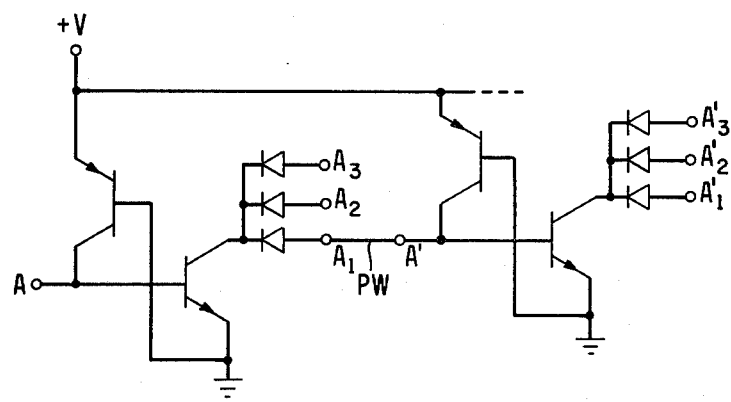
FIG. 6 is a schematic diagram of a variant of the circuit of FIG. 3 wherein a single collector is associated with three Schottky barrier diodes.

Logic circuits such as the prior art circuit of FIG. 1 and circuits in accordance with the present invention such as those shown in FIG. 3 and 6 are typically cascaded in complex arrangements to achieve desired logic functions. Typically, a collector, e.g., A1 of the circuit of FIG. 1, is connected to an input or base terminal A of a succeeding circuit. The state of conduction of the multiple collector transistor 102 which comprises the emitter connected to ground, the base connected to the terminal A, and the three collectors connected to the terminals A1, A2, and A3, respectively, is controlled by the state of the circuit which drives the base of transistor 102. The current source which comprises the potential +V and the transistor 101 is continuously in the conducting state. The current which occurs at the collector of the transistor 101 serves to turn on the transistor 102 unless the collector current of the transistor 101 is diverted through a lower impedance path such that the potential at the base of the transistor 102 is less than the turnon voltage of the transistor 102. Typically, the turnon voltage of the transistor 102 is 0.6 to 0.7 volts. If the driving transistor connected to terminal A in FIG. 1 is in the conducting state the current from the collector of the current source 101 will be diverted through a path which includes the collector to base and base to emitter junctions of the driving transistor to ground. In the conducting state the potential at the collector of the driving transistor would be in the order of 0.05 to 0.1 volts. The magnitude of the voltage drop depends on device construction and can be controlled within reasonable limits during manufacture. Accordingly, the current from the current source 101 will be diverted to ground through the driving transistor and the transistor 102 will be held in the OFF state of conduction.

If the driving transistor is in the nonconducting state, the impedance of the path to ground via the collector to base and base to emitter junctions of that transistor will be extremely high and very little of the current from the current source 101 will be diverted to ground via that path. Accordingly, the current from the current source transistor 101 will flow into the base to emitter junction of the transistor 102 to establish the ON state of conduction of the transistor 102.

In this prior art circuit arrangement which comprises two circuits or stages such as shown in FIG. 1 in cascade, the voltage at the node A of the driven transistor varies between approximately 0.05 volts and approximately 0.7 volts. The control which is exerted on the driven transistor 102 is accomplished primarily by steering current between the base to emitter junction of the driven transistor and the collector circuit of the driving transistor. Since it is contemplated that the driving and the driven transistors exist on a single chip wherein there is no significant source of noise, the above-described variation in signal of approximately 600 millivolts at node A is excessive and is incompatible with fast turnon and, to a lesser degree, fast turnoff of the driven transistor.

The time delay in the turnon of the driven transistor is directly proportional to the magnitude of voltage swing at the input, e.g., base of the driven transistor. As explained earlier herein, the speed of operation of devices constructed in accordance with the present invention is a significant improvement over the prior art structures. This, as explained earlier, is because of the improved impurity profiles. An additional improvement in circuit performance can be attributed to the presence of Schottky diodes as shown in the circuit arrangement of FIG. 3. In FIG. 3 there is shown a driven transistor 302, the current source 301 for the transistor 302, a driving transistor 312, a current source 311 for the driving transistor 312, and a plurality of Schottky diodes, e.g., 313 and 303, disposed in the collector circuits of both the driving and the driven transistors 312 and 302, respectively. As shown in FIG. 3, the collector terminal A1 of the driving transistor 312 is connected to the node A' which is the base terminal of the driven transistor 302. A Schottky diode, e.g., 315, typically has a forward threshold voltage drop in the order of 0.4 to 0.5 volts. The magnitude of the voltage drop can be determined and controlled in manufacture. The forward voltage drop of the diode 315, when added to the voltage drop of the driving transistor 312 in the ON state, results in a potential between 0.45 and 0.6 volts for the ON state of the transistor 312. As explained above, the actual voltage drops of the diode and the transistor are controlled by design and through manufacturing control. The maximum potential at node A is determined by the base to emitter drop of the driven transistor 302 and, as previously indicated, this voltage drop is in the order of 0.7 volts. Accordingly, it is possible that the voltage at node A can be varied between 0.45 and 0.7 volts to define the OFF and ON states of the driven transistor 302. This swing from 0.45 to 0.7 volts or 250 millivolts is substantially lower than the signal swing in circuits of the prior art shown in FIG. 1. Accordingly, the turnon times of driven transistors of the circuit configuration of FIG. 3 are substantially lower than the turnon times of circuits of FIG. 1. The swing of 250 millivolts is calculated on the basis of minimum voltage drop in the collector circuit of the driving transistor and minimum forward voltage drop of the Schottky diode in the collector of the driving transistor. It is reasonable to expect that in an actual situation the voltage at node A of a driven transistor will by design swing approximately 100 millivolts between an OFF voltage of 0.6 volts and an ON voltage of approximately 0.7 volts. This swing results in a very significant reduction in response time. Accordingly, the circuit arrangement of FIG. 3 provides a substantial increase in speed of operation for a given power level and for a given transistor structure.

Logic functions can be implemented by tying together the collector terminals of two independent stages. Such interconnected transistors serve to provide an AND function. If the two (or more) transistors whose collectors are tied together are both in the nonconducting state, the current from the current source of the driven stage will be steered to turn ON the transistor of the driven stage. However, if either driving transistor is conducting, the driven transistor will be held in the OFF state. As is well known in the prior art, other logic functions, e.g., OR, can be implemented through the use of inversion and this basic tying together of collector terminals to form an AND function.

In the circuit arrangement of FIG. 3 the transistor 302 is never in the fully nonconducting state. That is, if the voltage at the base terminal thereof is varied typically between 0.6 and 0.7 volts the collector current will vary between a low level of conduction, e.g., 1 or 2 percent of saturation and a relatively high level current, e.g., one milliamp. Accordingly, a Schottky diode in a collector circuit of the transistor 301, e.g., the diode 305, will for all states of conduction of the transistor 302 be forward biased and there will not be large signal swings at the collector of the transistor 202.

The voltage drops associated with the transistors, e.g., 302 and 312, and associated with the Schottky diodes, e.g., 303, 304, and 305, are typical for a particular value of current supplied by the current source transistor 301. The voltage drops in the transistors, e.g., 312, and in the Schottky diodes, e.g., 315, are both related in a similar manner to the magnitude of the current supplied by the transistor 301. If the current from the source 301 is by design or by other circumstances varied within reasonable limits, the voltage drops contributed by the transistor and by the Schottky diodes follow substantially parallel scaling paths. Accordingly, the magnitude of the difference between the ON and OFF voltages at the base of the driven transistor tend to remain constant independently of magnitude of the current supplied by the source 301. Similarly, the voltage drops in the transistor, e.g., 312, and the Schottky diode, e.g., 315, follow substantially parallel scaling paths as a function of change of temperature within reasonable limits. Therefore, for changes of temperature within reasonable limits the circuit arrangement of FIG. 3 tends to maintain a constant difference in voltage at the base of transistor 302. As a result, the circuit arrangement of FIG. 3 is self-compensating in the presence of reasonable variations in magnitude of current supplied by the current source 301 and compensating for reasonable variations in temperature of the devices.

Figure 4:
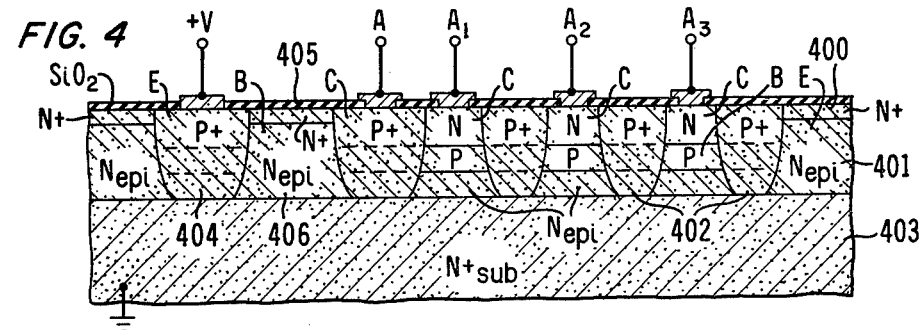
FIG. 4 is a cross section of a physical embodiment of the circuit of FIG. 3.

A side view of a typical device, e.g., current source transistor 301 and the driven transistor 302, is shown in FIG. 4. The invention as illustrated in FIG. 4 utilizes an N-type epitaxial layer 401 overlying an N+ substrate 403. The elements of the side view of FIG. 4 can best be understood by reference to the corresponding top view of FIG. 5 and the circuit of FIG. 3. The letter labels utilized in the circuit of FIG. 3 are consistent with those used in the apparatus drowings of FIGS. 4 and 5.

Figure 2:
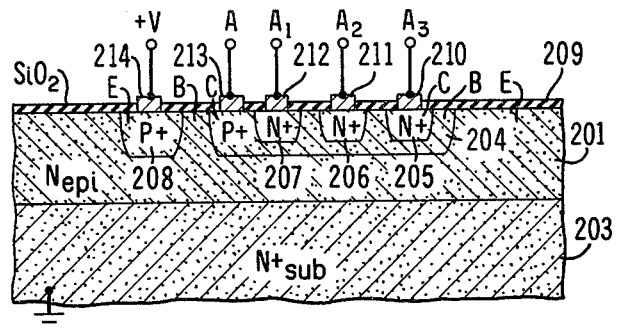
FIG. 2 is a cross section of the physical embodiment of the prior art circuit of FIG. 1.

The elements of a three-element semiconductor device are usually arbitrarily termed the emitter, base, and collector in accordance with the best mode of operation of the device. This is in recognition of the fact that three-element semiconductor devices are generally not symmetrical in structure and in electrical behavior. The usual asymmetry present in a three-element semiconductor device is in the base region of the device and relative doping of collector and emitter. For example, in the prior art structure of FIG. 2 the base region 204 is more heavily doped in the portions which are closer to the exposed surface of the epitaxial layer than the portion which lies closer to the substrate 203. Since in the prior art arrangement of FIG. 2 the gradient of the impurity of the base region 204 is in the direction of the emitter which is formed of the epitaxial layer 201, this device from a standpoint of accepted terminology is operated in the inverse mode. That is, the geometry of the above-identified regions of FIG. 2 and the impurity profiles in those identified regions in FIG. 2 are such that electrical performance is better when one of the elements 205, 206, 207 is utilized as an emitter and the portion of the epitaxial layer 201 which forms an active element of the three-element device is utilized as a collector. Thus, in the forward mode of operation of the device of FIG. 2, it is possible to have multiple emitters but not multiple collectors as is a requirement for the logic circuits of FIG. 1 and 3. Since the device of FIG. 2 must be operated in the inverse mode to achieve the circuit arrangement of FIG. 1, the electrical performance of that circuit arrangement suffers with respect to gain and response time.

The current source transistor 101 of FIG. 1 is comprised in FIG. 2 of the emitter region 208, an active base portion of the epitaxial layer 201, and an active collector portion of the region 204. In the structure of FIG. 2, the emitter region 208 of the current source transistor 101 of FIG. 1 is surrounded completely by N-type epitaxial material while in the structure of FIG. 4 the emitter region 404 of the lateral current source transistor 311 of FIG. 3 adjoins the resistive substrate. Since the emitter region 404 is surrounded by N+ material at the substrate and at the exposed surface of the epitaxial layer, injection is limited to the lateral N region 406 of the epitaxial layer. This reduces the stored charge in the lateral PNP transistor. Furthermore, the resistive N+ region 405 as shown in FIG. 4 enhances the electrical performance of the lateral current source transistor 311 as it tends to prevent recombination of minority carriers at the exposed surface and thus increases the gain of the lateral current source transistor.

Figure 5:
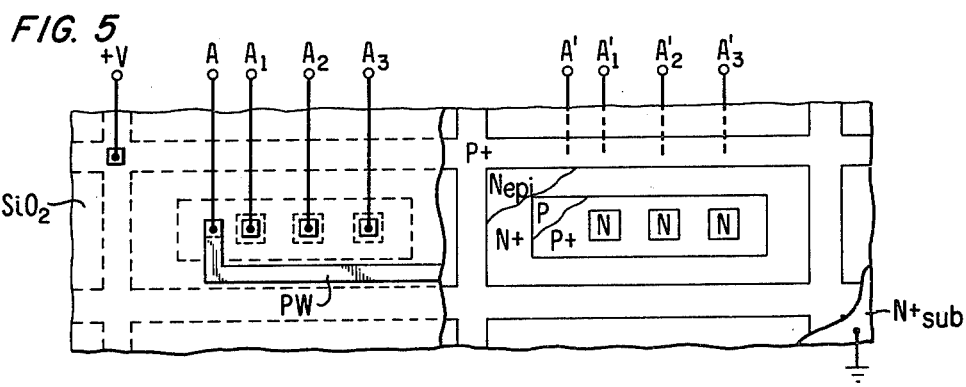
FIG. 5 shows a possible layout of a plurality of devices such as shown in FIG. 3 and 4 along with the arrangements for the distribution of power and signals.

One possible physical arrangement of a number of multiple collector transistors is shown in FIG. 5. In FIG. 5 power (+V) is applied at the exposed surface of the epitaxial layer and is distributed by means of P+ channels which are through-extending from the surface of the epitaxial layer to the substrate. Accordingly, the emitters of the lateral current source transistors, e.g., 301 and 311, are interconnected by the P+ channels and a single metallized contact is sufficient for applying power except where additional connections are employed to reduce circuit resistance. Similarly, ground is distributed by means of the N+ substrate which adjoins the emitters, e.g., 402 of FIG. 4. As shown in FIG. 4 and 5, the base regions of the three vertical transistors of FIG. 4 are interconnected by the through-extending P+ channels which surround the vertical transistors. An active portion of this P+ channel comprises the collector of the lateral current transistor and the remainder of the P+ channel serves to interconnect that collector with the base regions of the three vertical transistors of FIGS. 4 and 5. The transistor configuration shown in FIG. 4 may be connected one to the other through metallized surface connections overlying a nonconducting layer, e.g., an oxide layer or may be connected to other devices on or off the chip.

Figure 7:
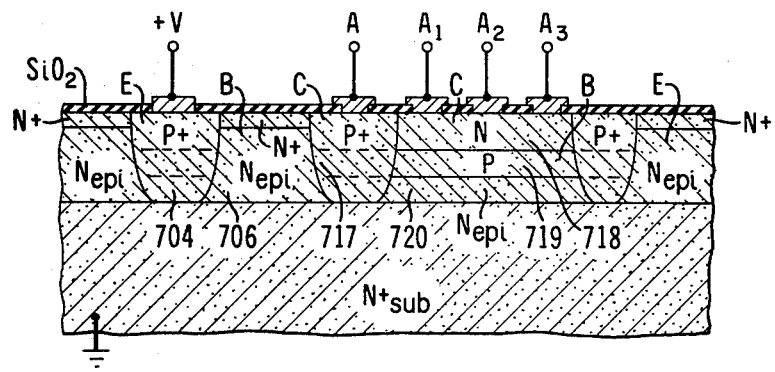
FIG. 7 is a cross section of a physical embodiment of the circuit of FIG. 6.

A possible variation of the physical structure of FIGS. 3, 4, and 5 is shown in FIGS. 6 and 7. In FIG. 6 there is shown a circuit which utilizes a vertical transistor having a single emitter, a single base, and a single collector with a plurality of Schottky diodes connected thereto. The transistors 302 and 312 shown in FIG. 3 are illustrated as comprising a single emitter and a single base and multiple collectors; however, as shown in FIG. 4 there are, in fact, three separate vertical transistors having their emitters and bases interconnected so that these three vertical transistors tend to operate as one. As shown in FIG. 7, the circuit of FIG. 6 is achieved by means of a single vertical NPN structure having three metallized Schottky contacts to the collector region thereof. In FIG. 7 there is shown a lateral current source transistor comprising the emitter 704, the base 706, and a collector which comprises an active portion of the P+ trough 717 along with a vertical transistor which comprises collector region 718, implanted base region 719, and emitter region 720. The structure of FIG. 7 corresponds to the structure of FIG. 4 except for the omission of two of the three vertical structures of FIG. 4 and the inclusion of three metallized contacts at the collector region 718. The circuit of FIG. 6 exhibits electrical characteristics similar to those of FIG. 3.

Figure 8:
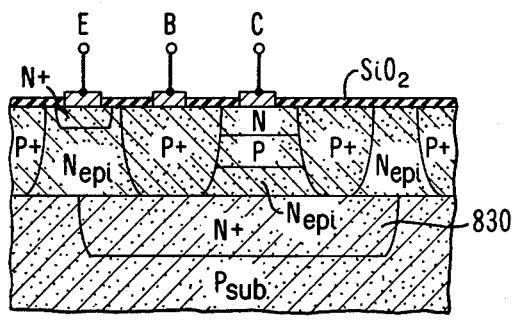
FIG. 8 and 9 are cross sections of a variant of the structure of FIG. 4 to form isolated transistors.
Figure 9:
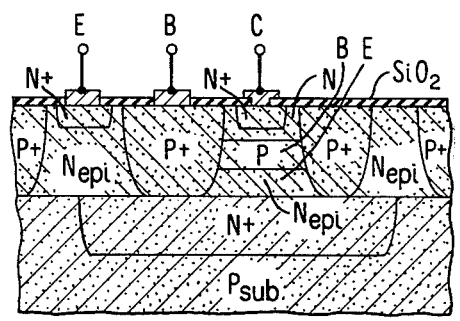

One possible variation of the basic structure of FIG. 4 is illustrated in FIGS. 8 and 9. In FIGS. 8 and 9 the three-element vertical transistor is formed over an N+ region which was established in a P-type substrate. The N+ region 830 can be formed in the P-type substrate prior to the time the epitaxial layer is established thereon. For the purpose of this invention, the N+ region 830 performs in the same manner that an N+ substrate such as 403 of FIG. 4 performs. In FIG. 8 there is shown a single vertical three-element transistor with a Schottky diode contact at the collector while in FIG. 9 there is similarly shown a single three-element vertical transistor with an ohmic connection at the surface. In FIGS. 8 and 9 connection to the emitter is via an ohmic connection at the surface of the epitaxial layer and connection to the base is by an ohmic connection to the through-extending P+ trough surrounding the vertical transistor.

FIGS. 8 and 9 show that it is possible to provide isolated devices within a single chip in accordance with this invention and that connection to such devices can be made through ohmic contacts at the surface of the epitaxial layer.

The structure and the method of this invention can be achieved through readily available technology. That is, standard semiconductor processing steps, e.g., masking, etching, diffusing, and ion implantation, are utilized to produce the claimed structures. The method of manufacture set forth herein has been in terms of effect rather than in terms of specific techniques except where the technique is essential to the practice of the invention. For example, in the practice of this invention the base regions of the vertical transistors are formed by ion implantation. The following is a brief discussion of typical steps utilized in the manufacture of the structure of this invention and in the practice of the method of this invention.

The body comprises an N+ substrate (or a P substrate with one or more N+ regions priorly diffused into the P type substrate) and a conventional N-type epitaxial layer overlying the substrate. Conventional masking techniques are utilized to define the locations of the through-extending P+ regions which are subsequently established through standard diffusion techniques. A second masking step is utilized to define the regions where the P-type base zones are to be implanted. Again, conventional methods of masking and of ion implantation are utilized at this point in the process. Following production of the base zones in the vertical transistors a third masking operation is utilized to produce a pattern for a thin N+ layer at selected locations of the surface at which ohmic contact to N-type regions is desired. This thin N+ region can be produced by diffusion or by ion implantation. Subsequently a pattern of contact windows is produced to define the locations at which Schottky diode contacts are to be formed. The devices on the body are subsequently interconnected by a metalization process (e.g., aluminum) which is suitable for both the ohmic and the Schottky diode contacts.

This invention has been explained by specific illustrative examples. However, it is apparent to one skilled in the art that this invention may be practiced to advantage in other specific embodiments.

What is claimed is:

1. A semiconductor structure comprising: a lightly doped first layer of one conductivity type overlying a more heavily doped second layer of said one conductivity type; at least one region of the opposite conductivity type extending through said first layer and shaped to encircle a corresponding selected region thereof, a further region of the said opposite conductivity type within said encircled region between but spaced apart from the surfaces of said first layer and extending to said through-extending encircling region, and a metallized contact at the exposed surface of said first layer and overlying a part of a corresponding encircled region.

2. A semiconductor structure according to claim 1 wherein said metallized contact forms a Schottky diode.

3. A semiconductor structure in accordance with claim 1 wherein the impurity profile of said region of the said opposite type spaced apart from the surfaces of said first layer is substantially symmetrical relative to the surfaces of said first layer.

4. A semiconductor structure in accordance with claim 1 wherein said metallized contact is an ohmic connection.

5. A semiconductor structure in accordance with claim 1 further comprising: another region of the said opposite conductivity type extending through said first layer to said second layer and spaced apart from said through-extending encircling region of said opposite conductivity type thereby forming with a portion of said encircling region and a region of said first layer a lateral current source transistor.

6. A semiconductor structure in accordance with claim 5 further comprising an ohmic region having an excess of impurity of the one conductivity type at the exposed surface of said first layer extending between said one and said another through-extending regions of said opposite conductivity type.

7. A semiconductor structure in accordance with claim 1 wherein said second layer is of the first conductivity type and has an excess of impurity.

8. A semiconductor structure in accordance with claim 1 wherein second layer is of the second conductivity type and there exists in said second layer a region of the first conductivity type having an excess of electrons and underlying said encircled region and said encircling region in said first layer.

9. A semiconductor structure comprising: a substantially uniform epitaxial layer of N-type conductivity overlying a substrate; at least one P-type conductivity region extending through said epitaxial layer and shaped to encircle a corresponding selected region of the epitaxial layer, a P-type conductivity region within said encircled region between but spaced apart from the surfaces of said epitaxial layer and extending to said through-extending P-type region, and a metallized contact at the exposed surface of the epitaxial layer and overlying a part of the corresponding encircled region.

10. A semiconductor structure according to claim 9 wherein said metallized contact forms a Schottky diode.

11. A semiconductor structure in accordance with claim 9 wherein the impurity profile of said P-type region spaced apart from the surfaces of said epitaxial layer is substantially symmetrical relative to the surfaces of said epitaxial layer.

12. A semiconductor structure in accordance with claim 9 further comprising a P-type conductivity region extending through said epitaxial layer to said substrate and spaced apart from said through-extending P-type conductivity region, thereby forming a lateral current source transistor.

13. A semiconductor structure in accordance with claim 12 further comprising an N+ region at the exposed surface of said epitaxial layer between said through-extending P-type conductivity regions.

14. A semiconductor integrated circuit comprising: a semiconductor body including an epitaxial layer of one conductivity type and a substrate portion likewise of said one conductivity type and of higher conductivity underlying said epitaxial layer, at least one zone of opposite conductivity type extending substantially through said epitaxial layer and encircling a region of said epitaxial layer, another zone of opposite conductivity type within said encircled region between but spaced apart from the surfaces of said epitaxial layer and extending to said through extending one zone, and at least one metallized contact at the exposed surface of the epitaxial layer overlying a part of said encircled region.

15. An integrated semiconductor structure comprising: an epitaxial layer of one conductivity type overlying at least a first region having an excess of impurity of said one conductivity type; at least one region of the opposite conductivity type extending substantially through said epitaxial layer and shaped to encircle a corresponding selected region thereof and lying wholly above a corresponding one of said first regions, a further region of said opposite conductivity type within the encircled region and between but spaced apart from the surfaces of said epitaxial layer and extending to said through extending encircling region.

16. An integrated semiconductor structure in accordance with claim 15 further comprising: a semiconductor substrate of said opposite conductivity type and wherein said first region having an excess of impurity of said one conductivity type lies within said semiconductor substrate.

17. An integrated semiconductor structure in accordance with claim 16 further comprising: an isolating region of said opposite conductivity type extending through said epitaxial layer and spaced apart from said encircling through extending one region of the opposite conductivity type so as to contact said substrate outside said first region having an excess of impurity of said one conductivity type.

18. An integrated semiconductor structure in accordance with claim 17 further comprising: at least one additional region of said opposite conductivity type spaced apart from said encircling region and from said isolating region and extending through said epitaxial layer to said substrate and overlying said first region.

19. An integrated semiconductor structure in accordance with claim 18 further comprising: an ohmic region of said one conductivity type at the exposed surface of said epitaxial layer, extending between said through extending encircling region and said spaced apart through-extending region of the opposite conductivity type.

20. An integrated semiconductor structure in accordance with claim 15 further comprising: at least one metallized contact at the surface of said epitaxial layer and overlying a part of a corresponding encircled region.

21. An integrated semiconductor structure in accordance with claim 20 wherein said metallized contact forms a Schottky diode.

22. An integrated semiconductor structure in accordance with claim 20 further comprising: a further region having an excess of impurity of said one conductivity type at the surface of said epitaxial layer overlying a part of a corresponding encircled region and wherein said metallized contact forms an ohmic connection.

* * * * *